United States Patent
Shioga et al.

(10) Patent No.: US 8,264,063 B2
(45) Date of Patent: Sep. 11, 2012

(54) CAPACITIVE ELEMENT, METHOD OF MANUFACTURE OF THE SAME, AND SEMICONDUCTOR DEVICE

(75) Inventors: Takeshi Shioga, Kawasaki (JP); John David Baniecki, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 61 days.

(21) Appl. No.: 12/222,764

(22) Filed: Aug. 15, 2008

(65) Prior Publication Data

US 2008/0315358 A1    Dec. 25, 2008

Related U.S. Application Data

(62) Division of application No. 11/581,383, filed on Oct. 17, 2006, now Pat. No. 7,439,199.

(51) Int. Cl.
*H01L 29/00* (2006.01)
*H01G 4/228* (2006.01)

(52) U.S. Cl. ............. 257/532; 257/E27.048; 361/306.3

(58) Field of Classification Search ................ 257/532, 257/295, 296, E21.009, E21.021, E27.048, 257/E29.001; 361/303, 305, 311, 313, 306.3, 361/328
See application file for complete search history.

(56) References Cited

U.S. PATENT DOCUMENTS

| | | | |
|---|---|---|---|
| 5,479,316 A * | 12/1995 | Smrtic et al. ................ | 361/322 |
| 5,767,564 A * | 6/1998 | Kunimatsu et al. ........... | 257/532 |
| 5,864,932 A | 2/1999 | Evans et al. | |
| 6,177,716 B1 * | 1/2001 | Clark ............................. | 257/532 |
| 6,242,299 B1 * | 6/2001 | Hickert ......................... | 438/240 |
| 6,504,202 B1 * | 1/2003 | Allman et al. ................ | 257/303 |
| 6,818,469 B2 | 11/2004 | Mori et al. | |
| 2002/0006024 A1 | 1/2002 | Pulsford et al. | |
| 2002/0006700 A1 * | 1/2002 | Kanamori et al. ............ | 438/253 |
| 2002/0070400 A1 | 6/2002 | Shibuya et al. | |
| 2002/0179952 A1 * | 12/2002 | Nakata ........................... | 257/303 |
| 2003/0219956 A1 * | 11/2003 | Mori et al. ..................... | 438/393 |
| 2004/0004793 A1 * | 1/2004 | Mikawa et al. ................ | 361/15 |
| 2004/0087082 A1 | 5/2004 | Nakata | |
| 2004/0130849 A1 * | 7/2004 | Kurihara et al. .............. | 361/311 |

FOREIGN PATENT DOCUMENTS

| | | |
|---|---|---|
| JP | 4-211191 A | 8/1992 |
| JP | 6-310649 A | 11/1994 |
| JP | 7-111318 A | 4/1995 |
| JP | 7-176453 A | 7/1995 |
| JP | 7-183470 A | 7/1995 |

(Continued)

OTHER PUBLICATIONS

International Search Report of PCT/JP2004/010132 date of mailing Oct. 26, 2004.

(Continued)

*Primary Examiner* — Victor A Mandala
*Assistant Examiner* — Selim Ahmed
(74) *Attorney, Agent, or Firm* — Westerman, Hattori, Daniels & Adrian, LLP

(57) ABSTRACT

A capacitive element is characterized by including: a base (12); a lower barrier layer (13) formed on the base (12); capacitors ($Q_1$ and $Q_2$) made by forming a lower electrode (14a), capacitor dielectric layers (15a), and upper electrodes (16a) in this order on the lower barrier layer (13); and an upper barrier layer (20) covering at least the capacitor dielectric layers (15a) and the lower barrier layer (13).

11 Claims, 10 Drawing Sheets

FOREIGN PATENT DOCUMENTS

| | | |
|---|---|---|
| JP | 7-273297 A | 10/1995 |
| JP | 2001-35990 A | 2/2001 |
| JP | 2001-68583 A | 3/2001 |
| JP | 2002-83892 A | 3/2002 |
| JP | 2002-110454 A | 4/2002 |
| JP | 2002-184946 A | 6/2002 |
| JP | 2002-280528 A | 9/2002 |
| JP | 2003-142590 A | 5/2003 |
| JP | 2003-523639 A | 8/2003 |
| JP | 2003-282827 A | 10/2003 |
| JP | 2003-282830 A | 10/2003 |
| JP | 2004-56097 A | 2/2004 |
| JP | 2004-119540 A | 4/2004 |

OTHER PUBLICATIONS

Japanese Office Action dated Nov. 10, 2009, issued in corresponding Japanese Patent Application No. 2006-527680.

* cited by examiner

CAPACITIVE ELEMENT, METHOD OF MANUFACTURE OF THE SAME, AND SEMICONDUCTOR DEVICE

CROSS-REFERENCE TO RELATED APPLICATIONS

This application is a Divisional of application Ser. No. 11/581,383, filed Oct. 17, 2006, which is a continuation of prior International Patent Application No. PCT/JP2004/010132, filed Jul. 15, 2004, the entire contents of which are incorporated herein by reference.

TECHNICAL FIELD

The present invention relates to a capacitive element, a method of manufacture of the same, and a semiconductor device.

BACKGROUND ART

LSIs such as microprocessors are used by being mounted on circuit boards. It is rare that only an LSI is mounted on a circuit board. Usually, a decoupling capacitor is also mounted on the circuit board. The decoupling capacitor plays roles of reducing fluctuations in supply voltage line in a case of sudden fluctuations in the load impedance of the LSI or the like, and of reducing switching noise to stabilize the operation of the LSI in a high-frequency region of GHz. The performance of the decoupling capacitor needs to be improved in order to further enhance the speed of a semiconductor device such as an LSI and to further reduce the power consumption thereof. It should be noted that decoupling capacitors are also referred to as decoupling condensers or bypass condensers in some documents.

Between the decoupling capacitor and the LSI, wiring for electrically connecting them with each other is needed. If the wiring is too long, the inductances of the wiring makes it difficult for the decoupling capacitor to absorb the fluctuations in the supply voltage line and high-frequency ripples, and thereby, to sufficiently carry out the functions.

In view of this point, in Patent Document 1, a thin film capacitor is formed by stacking a dielectric layer and an electrode on a ceramic circuit board, thereby reducing the length of wiring between a capacitor and an LSI.

Moreover, Patent Documents 2 to 4 proposes an interposer type of capacitive element configured by stacking a lower electrode, a capacitor dielectric layer, and an upper electrode on a supporting substrate, and a structure in which the interposer type of capacitive element is interposed between a circuit board and an LSI.

FIGS. 1(a) and 1(b) are cross-sectional views of an LSI mounted on a circuit board using such an interposer type of capacitive element.

As shown in FIG. 1(a), in this conventional example, terminals 102 of a mother board 101 and terminals 104 of a mounting board 105 are electrically connected to each other by first solder bumps 103. In the mounting board 105, a depressed portion 105a is provided. In the depressed portion 105a, an interposer type of capacitive element 107 is accommodated. The capacitive element 107 and the mounting board 105 are electrically connected to each other by second solder bumps 106. In addition, third solder bumps 108 are provided on the upper surfaces respectively of the capacitive element 107 and the mounting board 105. Thus, a semiconductor element 109 such as an LSI is electrically connected to the capacitive element 107 and the mounting board 105 by the third solder bumps 108.

In the above-described structure, the capacitive element 107 is placed directly under the semiconductor element 109. Accordingly, the length of wiring between the semiconductor element 109 and the capacitive element 107 can be reduced. Moreover, the semiconductor element 109 is accommodated in the depressed portion 105a, thereby reducing the height of a package.

It should be noted that there is also a structure in which the depressed portion 105a is omitted as shown in FIG. 1(b), in the case where there is no need to reduce the height of the package as described above.

Hereinafter, a method of manufacturing a capacitive element used in the aforementioned structure of FIG. 1(a) will be described with reference to FIGS. 2(a) to 2(d). FIGS. 2(a) to 2(d) are cross-sectional views of a capacitive element of a conventional example in the process of being manufactured.

First, as shown in FIG. 2(a), an insulating layer 111 such as a silicon dioxide layer is formed on a silicon substrate 110. Then, a lower electrode 112, a capacitor dielectric layer 113, and an upper electrode 113 are formed thereon in this order.

A composite oxide dielectric material having a high relative dielectric constant is used for the capacitor dielectric layer 113 among these layers in order to obtain a large capacitor capacitance. As a material composing the lower electrode 112, platinum (Pt) or iridium (Ir) is used because they are materials which improve the crystalline orientation of the dielectric material and which can withstand a high-temperature environment during depositing the capacitor dielectric layer 113.

The lower electrode 112, the capacitor dielectric layer 113, and the upper electrode 114 described above constitute a capacitor Q.

Subsequently, as shown in FIG. 2(b), the upper electrode 112 and the capacitor dielectric layer 113 are patterned by the photolithography method, whereby a hole 115 having a depth which reaches the lower electrode 112 is formed in these layers.

Then, as shown in FIG. 2(c), photosensitive polyimide is applied to the entire surface by spin-coating and baked to be formed into an insulating protective layer 116. After that, this insulating protective layer 116 is exposed and developed, thus forming a lower electrode opening 116a in the hole 115 and forming an upper electrode opening 116b through which the upper electrode 114 is exposed.

Next, as shown in FIG. 2(d), by employing electro-plating and the like, a metal layer is formed in each of the openings 116a and 116b to be formed respectively into a lower electrode drawing pad 117 and an upper electrode drawing pad 118.

Thus, the basic structure of the capacitive element of the conventional example is completed.

When the polyimide constituting the insulating protective layer 116 is baked, water is released by a dehydration polycondensation reaction of acid anhydride and diamine constituting the polyimide. One example of the chemical formula thereof is shown in FIG. 3. In this example, in polyimide marketed in a varnish form, polyamic acid is produced from acid anhydride and diamine. By baking this polyamic acid, $H_2O$ is released due to a dehydration polycondensation reaction.

However, electrical characteristics of the capacitor dielectric layer 113 degrade due to a reducing atmosphere generated by water and the like. This may induce a short between the electrode layers 112 and 114. Such a problem is observed not only when the polyimide is baked, but also when water of an external environment is absorbed by the capacitor dielectric layer 113 and when the capacitor dielectric layer 113 is exposed to a reflow atmosphere for the solder bumps 106 and 108 (see FIG. 1(a)), which is a reducing atmosphere.

In particular, in the case where the lower electrode 112 is made of Pt, Pt produces radical hydrogen by catalysis with water, and the hydrogen easily passes through the Pt layer to reach the capacitor dielectric layer 113. Accordingly, a countermeasure to prevent degradation of the capacitor dielectric layer 113 is needed. In addition, this radical hydrogen causes oxygen deficiency in the capacitor dielectric layer at the interface with the lower electrode 112. This may also increase the leakage current of the capacitive element.

In view of this point, in a ferroelectric random access memory (FeRAM) in which a capacitor dielectric layer is made of a ferroelectric material, as described in Patent Document 5, a protective film made of nitride of any of silicon, titanium, and aluminum is formed to protect the capacitor dielectric layer.

In addition, in Patent Document 6, a hydrogen barrier layer is made of a nitride or an oxide any of titanium and iridium, and the hydrogen barrier layer prevents hydrogen from entering a capacitor dielectric layer.

Moreover, in Patent Document 7, it is also proposed to make a protective layer of metal organic compound (silicon alkoxides) which is hardened by reaction with water.

Furthermore, in Patent Document 8, it is proposed to make a protective layer of material, such as $La_5Ni$, having the property of storing hydrogen.

Patent Document 1: Japanese Patent Application Publication No. Hei 04-211191

Patent Document 2: Japanese Patent Application Publication No. 2001-68583

Patent Document 3: Japanese Patent Application Publication No. 2001-35990

Patent Document 4: Japanese Patent Application Publication No. Hei 07-176453

Patent Document 5: Japanese Patent Application Publication No. Hei 07-111318

Patent Document 6: Japanese Patent Application Publication No. 2003-282827

Patent Document 7: Japanese Patent Application Publication No. Hei 07-273297

Patent Document 8: Japanese Patent Application Publication No. 2003-282830

DISCLOSURE OF INVENTION

An object of the present invention is to provide a capacitive element, a method of manufacture thereof, and a semiconductor device, which make it possible to reduce the connection distance between the capacitive element and a semiconductor element without employing the aforementioned interposer structure, and to prevent capacitor characteristics from degrading in a reducing atmosphere.

According to one aspect of the present invention, a capacitive element is provided which includes: a base; a lower barrier layer formed on the base; capacitor made by forming a lower electrode, capacitor dielectric layers and upper electrodes in this order on the lower barrier layer; and an upper barrier layer covering at least the capacitor dielectric layer and the lower barrier layer.

This capacitive element has a structure in which the capacitor is surrounded from below and above by the lower and upper barrier layers. Accordingly, moisture in a high-humidity environment and hydrogen produced from the moisture are blocked by these barrier layers. Thus, the capacitor dielectric layer is prevented from getting damage such as an oxygen defect due to a reducing atmosphere of hydrogen or the like, and the reliability of the capacitive element is enhanced.

In addition, by constituting the upper barrier layer from the same material as the capacitor dielectric layer, the thermal expansion coefficients of the capacitor dielectric layer and the upper barrier layer become equal. As a result, the adhesion strength between the capacitor dielectric layer and the upper barrier layer becomes more favorable, as compared with the case where the capacitor dielectric layer and the upper barrier layer are made of different kinds of materials. Consequently, this makes it possible to prevent these layers from separating from one another in a portion where these layers are in contact with each other, when heat or mechanical stress is applied. Thus, the reliability of the capacitive element can be further enhanced.

Moreover, by also making the lower barrier layer of the same material as the capacitor dielectric layer, the capacitor are interposed between the lower and upper barrier layers made of the same material. Accordingly, the layer separation due to the difference between thermal expansion coefficients can be prevented more effectively.

By employing a base in a film form as the base included in the above-described capacitive element, the capacitive element is made very small in thickness, which can contribute to the miniaturization of an electronic instrument.

The thickness of the capacitive element is preferably 10 μm or less.

Moreover, according to another aspect of the present invention, a semiconductor device is provided which includes a semiconductor element; and a capacitive element including: a base; a lower barrier layer formed on the base; capacitor made by forming a lower electrode, capacitor dielectric layer and an upper electrode in this order on the lower barrier layer; and an upper barrier layer covering at least the capacitor dielectric layer and the lower barrier layer, the capacitive element being mounted on one of the surfaces of the semiconductor element.

The capacitive element included in this semiconductor device has excellent resistance to a reducing atmosphere as described previously. Accordingly, the reliability of this semiconductor device is also enhanced.

Furthermore, according to another aspect of the present invention, a method of manufacturing a capacitive element is provided. The method includes the steps of: forming a base on a supporting substrate; forming a lower barrier layer on the base; forming a first conductive layer, a dielectric layer, and a second conductive layer in this order on the lower barrier layer; patterning the first conductive layer, the dielectric layer and the second conductive layer to form capacitor consisting of a lower electrode, capacitor dielectric layer, and upper electrode; forming an upper barrier layer covering at least the capacitor dielectric layer and the lower barrier layer; and removing the supporting substrate after forming the upper barrier layer.

In this capacitive element manufacturing method, the capacitor is formed on the supporting substrate, and the supporting substrate is removed after the capacitor is formed. Accordingly, the handling of the capacitive element during manufacturing becomes favorable.

In addition, after the capacitor is formed, the upper barrier layer covering the capacitor dielectric layer and the lower barrier layer is formed. Accordingly, the capacitor is surrounded by the lower and upper barrier layers, and these barrier layers prevent hydrogen, water and the like from entering the capacitor dielectric layer. Thus, the capacitor dielectric layer is prevented from degradation.

In particular, in the case where a protective layer is formed on the upper barrier layer, these barrier layers effectively block water and hydrogen generated when the protective layer is formed. Thus, it becomes possible to realize both the formation of the protective layer and the prevention of deterioration of the capacitor.

Such protective layers include, for example, a layer containing polyimide resin. Water produced when this polyimide resin is baked is effectively blocked by the aforementioned lower and upper barrier layers.

In addition, the step of forming the base is preferably performed by applying resin to the supporting substrate and by thermosetting reaction the resin to form the base. This makes the capacitive element flexible and makes the thickness thereof small. Accordingly, the miniaturization of an electronic instrument can be advanced.

Moreover, in the step of forming the base, an adhesion layer may be formed on the supporting substrate, and the base may be formed on this adhesion layer. This increases the adhesion strength between the supporting substrate and the adhesion layer, prevents these from being delaminated from each other during the manufacturing process, and can improve the productivity of the capacitive element.

Such an adhesion layer includes, for example, a Ti—W alloy layer. The Ti—W alloy layer is preferably formed by DC sputtering in which a substrate bias voltage is applied. This makes it possible to control the grain growth of Ti—W. Accordingly, the film stress of the Ti—W alloy layer is moderated, and the base is more unlikely to become cracked due to the stress.

BEST MODES FOR CARRYING OUT THE INVENTION

Figure 1:
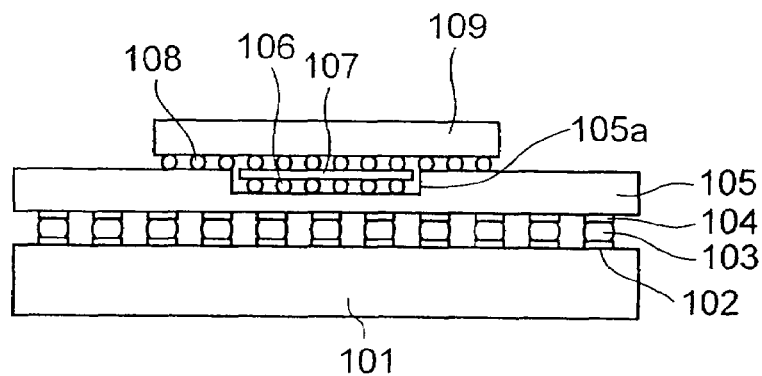
FIGS. 1(a) and 1(b) are cross-sectional views of an LSI mounted on a circuit board using an interposer type of capacitor of a conventional example.
Figure 1:
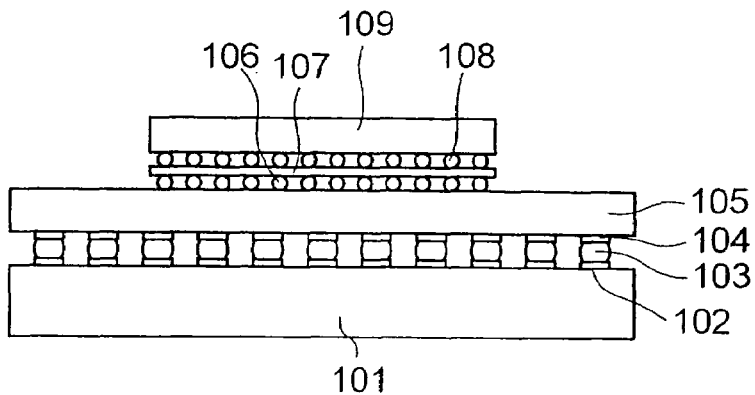
Figure 2:
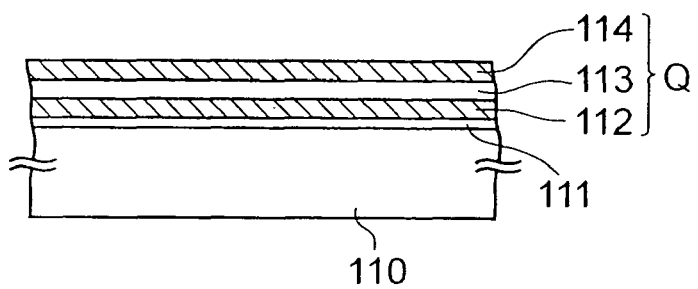
FIGS. 2(a) to 2(d) are cross-sectional views of a capacitive element of a conventional example in the process of being manufactured.
Figure 2:
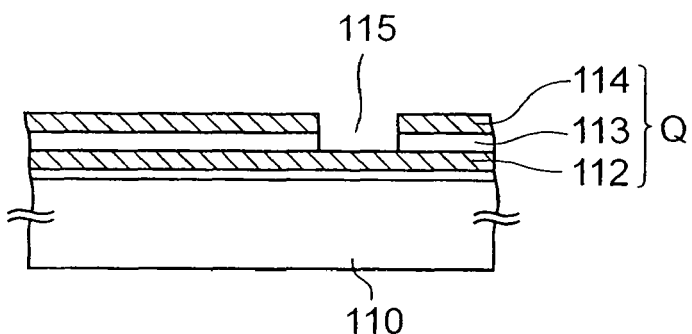
Figure 2:
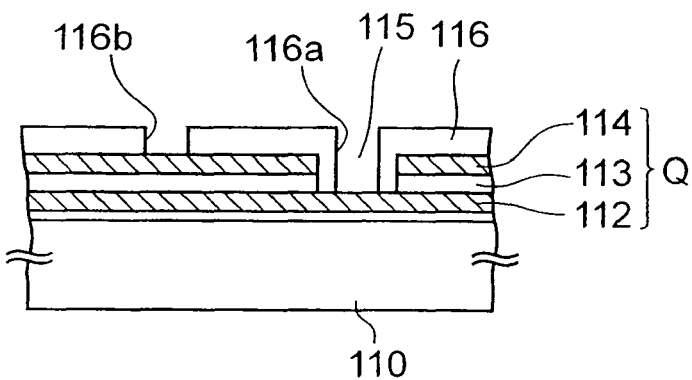
Figure 2:
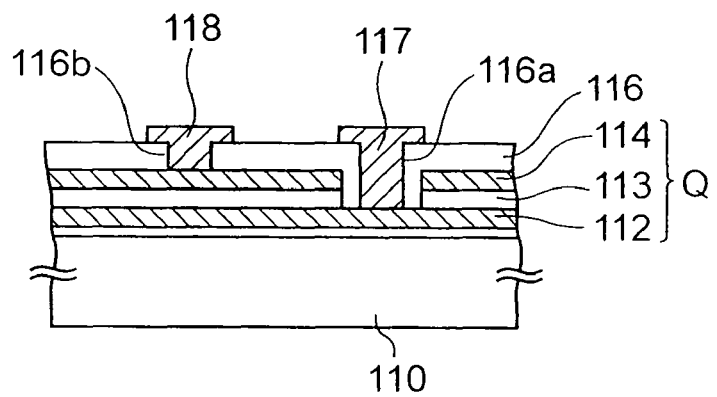
Figure 3:
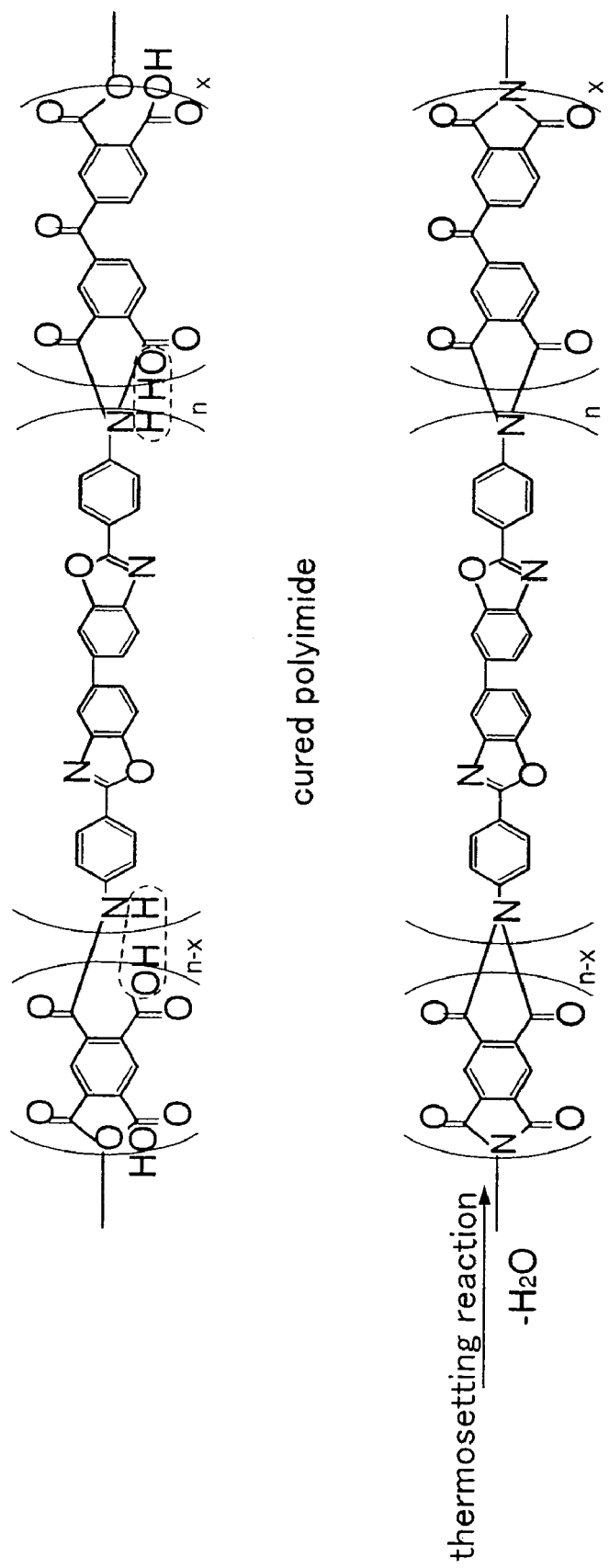
FIG. 3 is an example of a chemical formula indicating that water is released by a dehydration polycondensation reaction of acid anhydride and diamine constituting polyimide.
Figure 4:
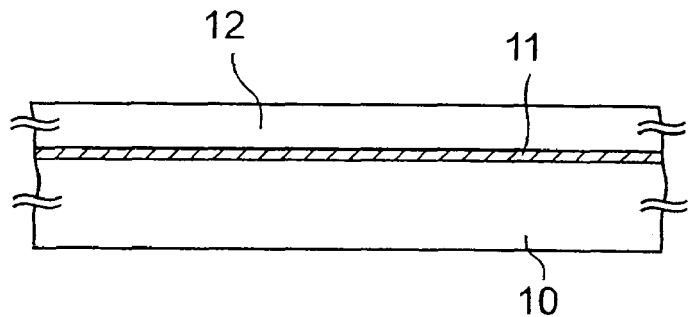
FIGS. 4(a) to 4(c) are cross-sectional views (part 1) of a capacitive element in the process of being manufactured according to a first embodiment of the present invention.
Figure 4:
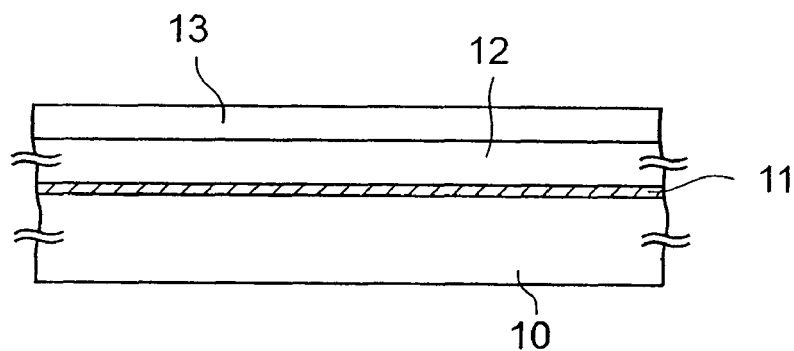
Figure 4:
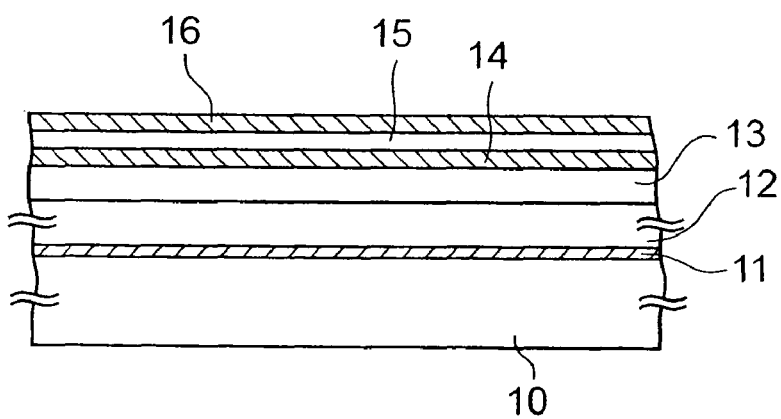
Figure 5:
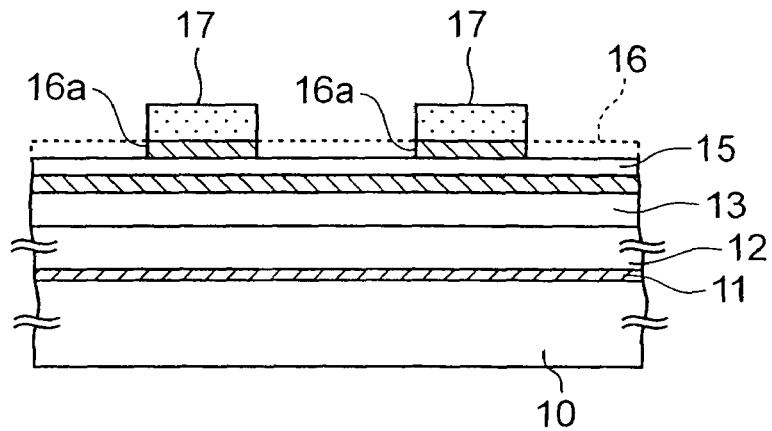
FIGS. 5(a) to 5(c) are cross-sectional views (part 2) of the capacitive element in the process of being manufactured according to the first embodiment of the present invention.
Figure 5:
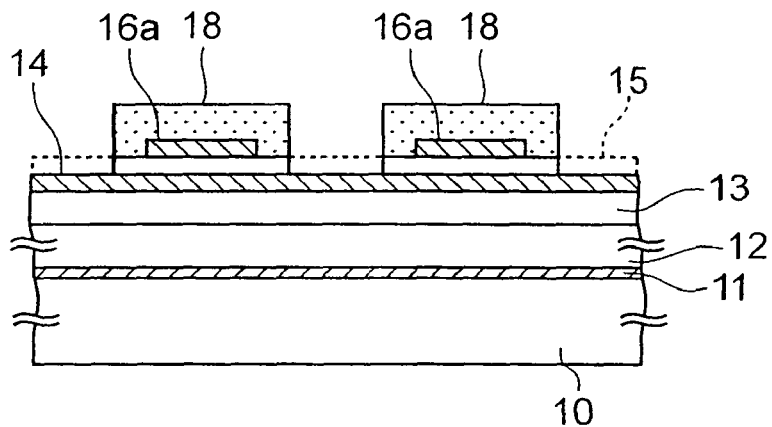
Figure 5:
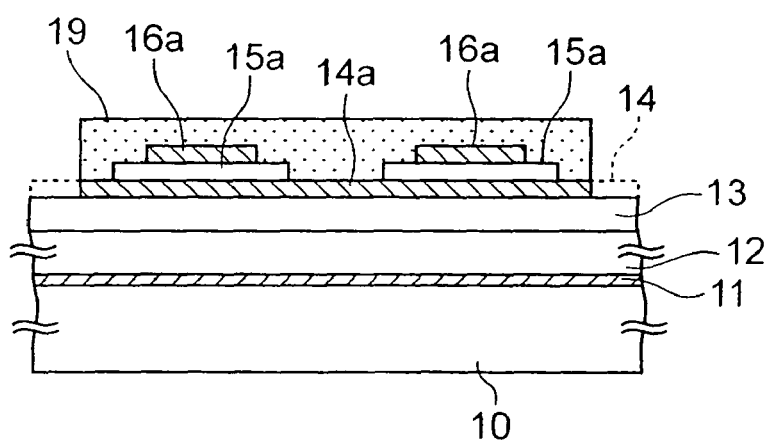
Figure 6:
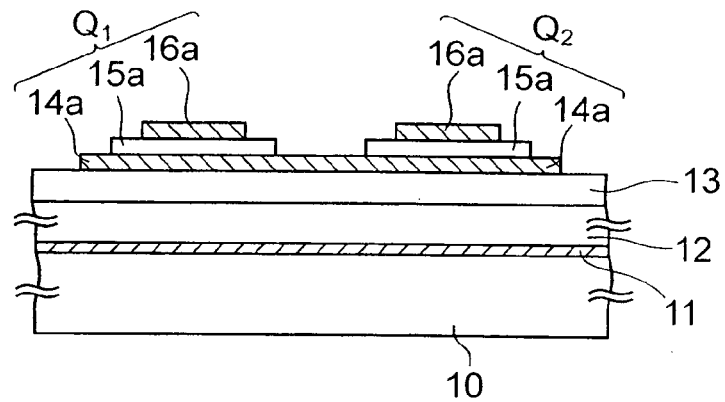
FIGS. 6(a) to 6(c) are cross-sectional views (part 3) of the capacitive element in the process of being manufactured according to the first embodiment of the present invention.
Figure 6:
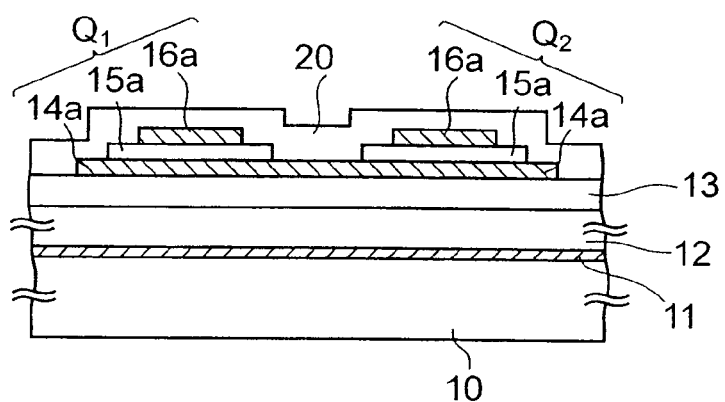
Figure 6:
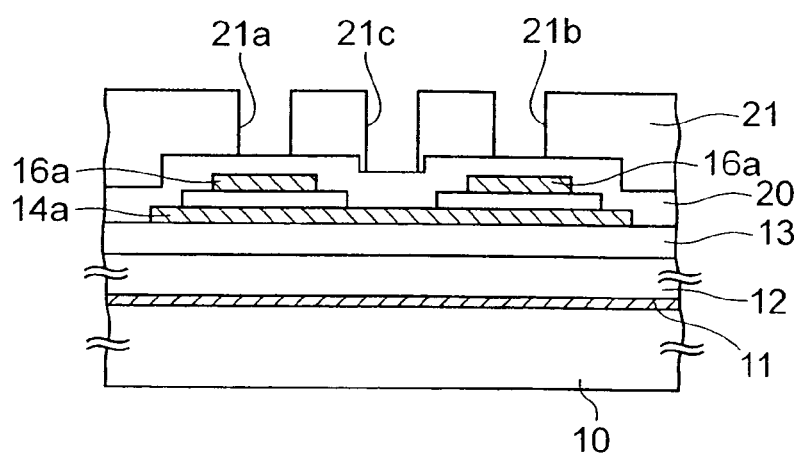
Figure 7:
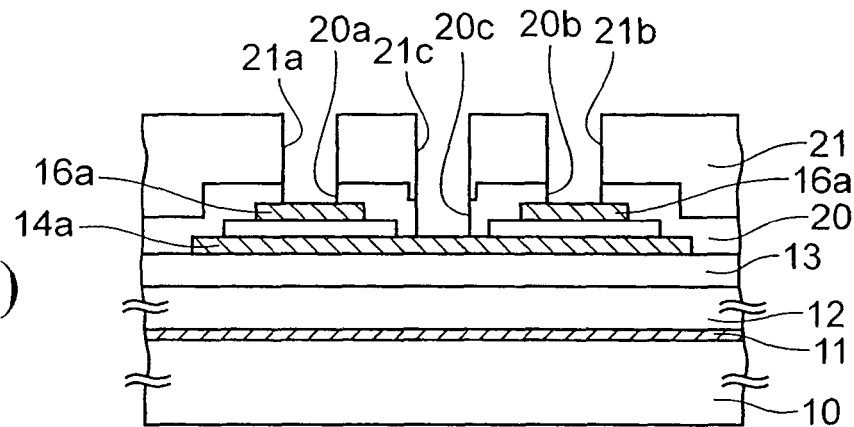
FIGS. 7(a) to 7(c) are cross-sectional views (part 4) of the capacitive element in the process of being manufactured according to the first embodiment of the present invention.
Figure 7:
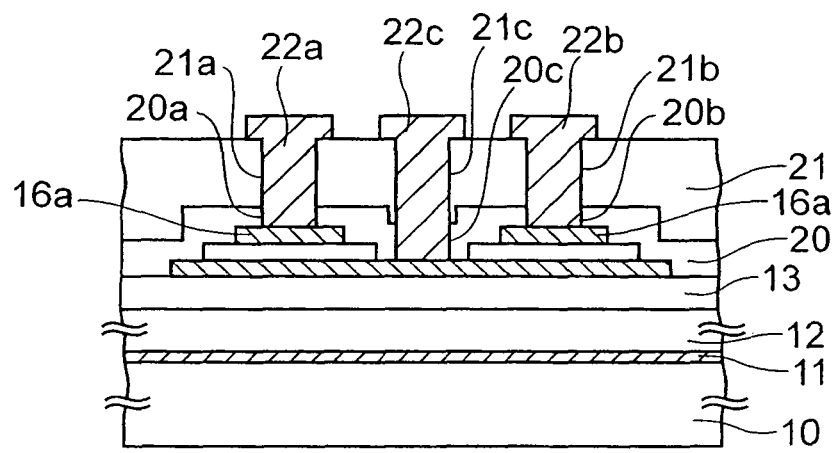
Figure 7:
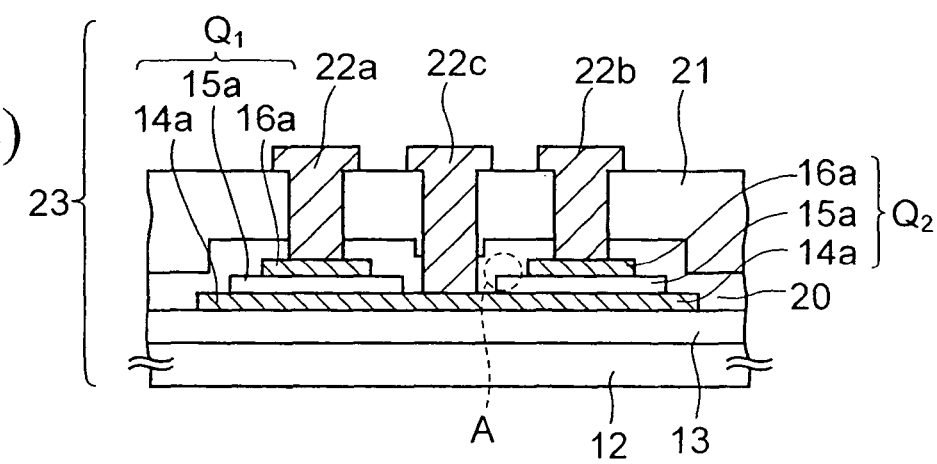

Hereinafter, best modes for carrying out the present invention will be described in detail with reference to the accompanying drawings.

(1) First Embodiment

FIGS. 4 to 7 are cross-sectional views of a capacitive element in the process of being manufactured according to a first embodiment of the present invention.

In order to manufacture this capacitive element, first, as shown in FIG. 4(a), a titanium (Ti) layer having a thickness of 300 nm and a copper layer having a thickness of approximately 250 nm are formed on a silicon substrate (supporting substrate) 10 as an adhesion layer 11 by sputtering.

Next, for this substrate 10, liquid polyimide resin (varnish) dissolved in a solvent is applied on the adhesion layer 11 by spin-coating under the following conditions: the number of revolutions is 1000 rpm, and the coating time is 30 seconds. Subsequently, this substrate 10 is put on a hot plate (not shown), and this polyimide resin is precured by heating at a substrate temperature of 90° C., and is then thermoset by baking at a substrate temperature of 400° C., thus forming a base 12 in a film form having a thickness of approximately 5 μm.

The base 12 is preferably made of a heat flexible resin material such as polyimide resin as above. The heat flexible resin material may be any of epoxy resin, bismaleimidetriazine (BT) resin, polytetrafluoroethylene (PTFE) resin, benzocyclobutene (BCB) resin, acrylic resin, and diallyl phthalate resin, other than polyimide resin.

In the case where the base 12 is made of epoxy resin among the above materials, epoxy varnish is applied to the top of the adhesion layer 11 to a thickness of 10 μm by spin-coating under the following conditions: the number of revolutions is 2000 rpm, and the coating time is 30 seconds. Subsequently, the epoxy varnish is pre-baked under a condition in which the substrate temperature is 60° C., and then main-baked at a substrate temperature of 300° C. to be formed into the base 12.

The adhesion strength between the base 12 and the silicon substrate 10 is increased by the adhesion layer 11, thus preventing the base 12 from being stripped from the silicon substrate 10 during manufacturing.

Subsequently, as shown in FIG. 4(b), an amorphous metal oxide layer, e.g., an alumina ($Al_2O_3$) layer, is formed as the insulating lower barrier layer 13 to a thickness of approximately 100 nm by sputtering using a gas mixture of Ar gas and $O_2$ gas as sputtering gas. As conditions for the sputtering, for example, a substrate temperature of 80° C., an RF (radio-frequency) power of 500 W, a gas pressure of 0.1 Pa, and an Ar gas to $O_2$ gas flow ratio of 5:1 are employed.

The alumina layer constituting this lower barrier layer 13 is formed in order to protect below-mentioned capacitor dielectric layers from outside water. By setting the film density of the alumina layer at 2.6 $g/cm^3$, the effect of blocking water can be made highest.

It should be noted that a material constituting the lower barrier layer 13 is not limited to an amorphous metal oxide material and that the lower barrier layer 12 may be made of silicon oxide ($SiO_2$) or silicon nitride ($Si_3N_4$).

Next, steps for obtaining the cross-sectional structure shown in FIG. 4(c) will be described.

First, a Ti—W alloy layer having a thickness of approximately 50 nm and platinum (Pt) layer having a thickness of 200 nm are formed in this order by DC sputtering to be used as a first conductive layer 14. Of the layers constituting this first conductive layer 14, the Ti—W alloy layer functions as a layer for increasing the adhesion between the Pt layer on the Ti—W alloy layer and the resin layer 12. However, if the stress of the Ti—W alloy layer is too large, the resin layer 12 may become cracked. Accordingly, in the DC sputtering for forming this Ti—W alloy layer, it is preferable that a substrate bias voltage be applied to promote the grain growth of Ti—W and to moderate the stress of the Ti—W alloy layer.

It should be noted that materials constituting the first conductive layer 14 are not limited to the above-described ones and that the first conductive layer 14 may be made of any of Au, Cr, Cu, W, Pt, Pd, Ru, Ru oxide, Ir, Ir oxide, and Pt oxide.

Next, $Ba_xSr_{1-x}TiO_3$ (hereinafter referred to as BST) is formed, as a dielectric layer 15, to a thickness of 100 nm on the first conductive layer 14 by sputtering using a gas mixture of Ar gas and $O_2$ gas as sputtering gas. Conditions for depositing this BST are not particularly limited. In this embodiment, the following conditions are employed: the substrate temperature is 200° C.; the gas pressure is 0.1 Pa; the Ar gas to $O_2$ gas flow ratio is 4:1; the power applied to a target is 500 W; and the deposition time is 30 minutes. Under such conditions, the BST having a dielectric constant of 100 and a dielectric loss of 1% or less can be deposited.

The orientation of this BST is aligned in one direction by a function of the Pt layer constituting the first conductive layer 14 under the BST, whereby high-dielectric characteristics of the BST are improved.

It should be noted that a material constituting the dielectric layer 15 is not limited to BST and that the dielectric layer 15 may be made of $Pb(Zr,Ti)O_3$ (hereinafter referred to as PZT). This PZT is formed by sputtering using a gas mixture of Ar gas and $O_2$ gas as sputtering gas. As conditions for depositing the PZT, for example, the following conditions are employed: the substrate temperature is 200° C.; the gas pressure is 0.5 Pa; the Ar gas to $O_2$ gas flow ratio is 9:1; the power applied to a target is 120 W; and the deposition time is 60 minutes. Under these conditions, a PZT layer having a dielectric constant of 200 and a thickness of 100 nm can be formed.

Alternatively, the dielectric layer 15 may be made of a composite oxide containing at least one of Sr, Ba, Pb, Zr, Bi, Ta, Ti, Mg, and Nb, other than BST and PZT.

Subsequently, a Pt layer is formed to a thickness of 200 nm by sputtering to be used as a second conductive layer 16. It should be noted that the second conductive layer 16 may be made of any of Au, Cr, Cu, W, Pd, Ru, Ru oxide, Ir, Ir oxide and Pt oxide, instead of the Pt layer.

Next, as shown in FIG. 5(a), a first resist pattern 17 having the shape of upper electrodes is formed on the second conductive layer 16. Using this first resist pattern 17 as a mask, the second conductive layer 16 is etched by Ar ion milling to be formed into upper electrodes 16a. After that, the first resist pattern 17 is removed.

Then, as shown in FIG. 5(b), a second resist pattern 18 having the shape of capacitor dielectric layers is formed on the dielectric layer 15. Using the second resist pattern 18 as a mask, the dielectric layer 15 is etched by Ar ion milling to be formed into capacitor dielectric layers 15a. After that, the second resist pattern 18 is removed.

Moreover, as shown in FIG. 5(c), a third resist pattern 19 having the shape of a lower electrode is formed on the first conductive layer 14. Using this third resist pattern 19 as a mask, the first conductive layer 14 is etched by Ar ion milling to be formed into a lower electrode 14a. After that, the third resist pattern 19 is removed.

Thus, as shown in FIG. 6(a), two capacitors $Q_1$ and $Q_2$, each of which is configured by stacking the lower electrode 14a, the capacitor dielectric layer 15a, and the upper electrode 16a in this order, are formed in sharing the lower electrode 14a.

Subsequently, as shown in FIG. 6(b), an alumina ($Al_2O_3$) layer is formed, as an insulating upper barrier layer 20, to a thickness of approximately 100 nm by sputtering using a gas mixture of Ar gas and $O_2$ gas as sputtering gas. Conditions for the sputtering are not particularly limited. For example, conditions similar to those for depositing the lower barrier layer 13 are employed.

A material constituting the upper barrier layer 13 is not limited to an amorphous metal oxide material such as alumina. The upper barrier layer 20 may be made of silicon oxide ($SiO_2$) or silicon nitride ($Si_3N_4$).

Next, processes until the cross-sectional structure shown in FIG. 6(c) is obtained will be described.

First, aminopropyltriethoxysilane ($NH_2(CH_2)_3Si(OCH_2)_3$) is applied, as a silane coupling agent, to the top of the upper barrier layer 20 by spin coating under conditions that the number of revolutions is 1500 rpm and that the coating time is 30 seconds. Thereafter, the applied silane coupling agent is cured on a hot plate under a condition that the substrate temperature is 400° C. Next, photosensitive polyimide resin is applied to the top of the above silane coupling agent under the conditions that the number of revolutions is 1000 rpm and that the coating time is 30 seconds. Then, this photosensitive polyimide resin is patterned by exposure and development, and is baked under a condition that the substrate temperature is 400° C., whereby forming a protective layer 21 having a thickness of approximately 3 μm. By the above-described exposure and development, in the protective layer 21, first holes 21a and 21b are formed over the upper electrodes 16a, and a second hole 21c is formed over the lower electrode 14 which is not covered with the upper electrodes 16a.

It should be noted that a material constituting the protective layer 21 is not limited to polyimide resin and that the protective layer 21 may be made of photosensitive BCB resin. In this case, BCB varnish is applied to the top of the upper barrier layer 20 to a thickness of 4.5 μm by spin coating under the conditions that the number of revolutions is 2000 rpm, and that the coating time is 30 seconds. Next, this BCB varnish is pre-baked at a substrate temperature of 70° C., and then the pre-baked BCB is exposed and developed to form the holes 21a to 21c, and is main-baked under a condition that the substrate temperature is 260° C., thus forming the protective layer 21 having a thickness of 3 μm.

Subsequently, as shown in FIG. 7(a), using the protective layer 21 as a mask, the upper barrier layer 20 is etched by plasma etching using Ar as etching gas. Thus, first openings 20a and 20b through which the upper electrodes 16a are exposed and a second opening 20c through which the lower electrode 14a is exposed are formed in the upper barrier layer 20.

Next, processes until the cross-sectional structure shown in FIG. 7(b) is obtained will be described.

First, a chromium (Cr) layer having a thickness of 0.5 μm and a copper layer having a thickness of 1 μm are formed in this order by sputtering, and then a gold layer is formed on these layers to a thickness of 10 μm by electro-plating. Then, these metal layers are patterned, thereby forming upper electrode drawing pads 22a and 22b electrically connected to the respective upper electrodes 16a through the first openings 20a and the first holes 21a, and a lower electrode drawing pad 22c electrically connected to the lower electrode 14a through the second opening 20b and the second hole 21c.

Next, processing until the cross-sectional structure shown in FIG. 7(c) is obtained will be described.

First, the surface of the silicon substrate 10 on which the capacitors $Q_1$ and $Q_2$ are not fabricated is polished by chemical mechanical polishing (CMP), thus reducing the thickness of the silicon substrate 10 to approximately 50 μm. This facilitates the etching of the silicon substrate 10 in next wet etching. Subsequently, by immersing the silicon substrate 10 in hydrofluoric acid, the silicon substrate 10 is completely removed, and the adhesion layer 11 is also removed by this etching process using hydrofluoric acid.

Figure 8:
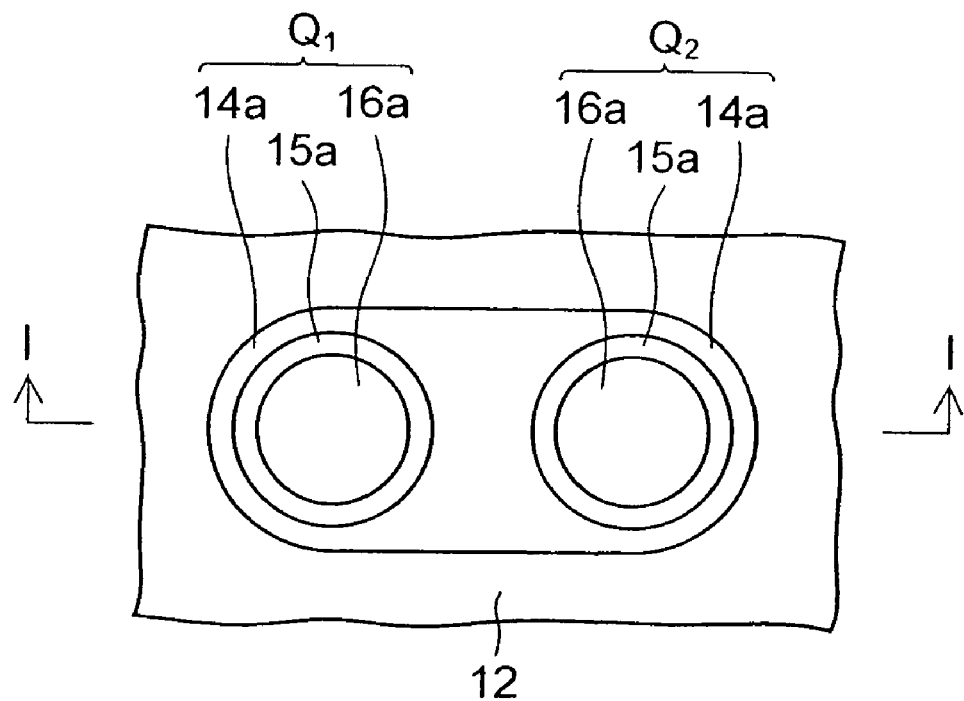
FIG. 8 is a plan view of the capacitive element according to the first embodiment of the present invention.

FIG. 8 is a plane view after this processing is finished. The aforementioned FIG. 7(c) corresponds to a cross-sectional view taken along a line I-I of FIG. 8. It should be noted that in FIG. 8, only the base 12, and the lower electrode 14a, the capacitor dielectric layers 15a, and the upper electrodes 16a constituting the capacitors $Q_1$ and $Q_2$ are shown, while other elements are omitted.

Thus, the basic structure of the capacitive element 23 according to this embodiment is completed.

This capacitive element 23 is flexible because both the base 12 and the protective layer 21 included in the capacitive element 23 are made of polyimide formed by spin-coating. In addition to the above-described spin-coating, the capacitor dielectric layers 15a are formed by sputtering. Accordingly, the total thickness of the capacitive element from the base 12 to the protective layer 21 can be reduced up to 10 μm or less. It should be noted that, in the case where epoxy resin is used as the base 12, the thickness of the capacitive element 23 becomes approximately 7 μm.

On the other hand, it is also considered to use, as capacitor dielectric layers, a film material obtained by mixing ceramic filler made mainly of a high dielectric constant material such as $BaTiO_3$ and epoxy resin, and by spreading the mixture by the doctor blade method. In this case, this film material is interposed between layers of a multilayer circuit board, and wiring layers of the multilayer circuit board and the film material constitute capacitors. However, in this structure, a dielectric filler having an average particle size of several micrometers needs to be contained in the film material in order to increase the dielectric constant of the film material to be used as the capacitor dielectric layers. Accordingly, the thickness of the capacitor becomes 20 to 100 μm due to the filler. Thus, a very thin capacitive element such as in this embodiment cannot be realized.

According to this embodiment described above, as shown in FIG. 7(c), the capacitors $Q_1$ and $Q_2$ are surrounded from below and above by the lower barrier layer 13 and the upper barrier layer 20. Accordingly, even if hydrogen is generated from water, which is produced when polyimide is thermoset to be formed into the protective layer 21 by the catalysis of Pt included in the electrodes 14a and 15a, and moisture in a high-humidity environment, or the like, the hydrogen and the water are blocked by the barrier layers 13 and 20. Consequently, the capacitor dielectric layers 15a are prevented from getting damage such as an oxygen defect due to a reducing atmosphere of hydrogen or the like. Thus, the reliability of the capacitive element 23 can be enhanced, and the life thereof can be made longer than those of conventional ones.

Moreover, according to the above, the capacitors $Q_1$ and $Q_2$ are formed on the rigid silicon substrate 10, and the silicon substrate 10 is removed by etching after the basic structures of the capacitors $Q_1$ and $Q_2$ are completed. Accordingly, the handling during manufacturing the capacitive element 23 can be made favorable.

In addition, both the base 12 and the protective layer 21 included in the capacitive element 23 are made of polyimide formed by spin-coating. This makes it possible to obtain the thin and flexible capacitive element 23, and can contribute to the miniaturization of an electronic instrument.

(2) Second Embodiment

This embodiment differs from the first embodiment only in materials constituting the lower barrier layer 13 and the upper barrier layer 20, but is the same as the first embodiment in the other aspects. Accordingly, a description will be given with reference to FIGS. 4 to 7 of the first embodiment.

In the first embodiment, the upper barrier layer 20 is made of the alumina layer. On the other hand, in this embodiment, the barrier layer 20 is made of the same material as the capacitor dielectric layers 15a, e.g., BST or PZT, in the step of FIG. 6(b).

For example, in the case where the capacitor dielectric layers 15a are made of BST, the BST is deposited on the capacitors $Q_1$ and $Q_2$ to a thickness of 100 nm by sputtering using a gas mixture of Ar gas and $O_2$ gas as sputtering gas. The deposited BST is used as the upper barrier layer 20. As deposition conditions in this case, for example, the following conditions are employed: the Ar gas to $O_2$ gas flow ratio is 8:1; the gas pressure is 0.2 Pa; the RF power is 800 W; and the substrate temperature is a room temperature. Thus, by employing the conditions in which the substrate temperature is not heated, the BST film does not crystallize but becomes amorphous.

As described above, since the upper barrier layer 20 is made of the same material as the capacitor dielectric layers 15a, the thermal expansion coefficients of the capacitor dielectric layers 15a and the upper barrier layer 20 become equal. Accordingly, the adhesion between the capacitor dielectric layers 15a and the upper barrier layer 20 becomes more favorable as compared with the case where the capacitor dielectric layer 15a and the upper barrier layer 20 are made of different kinds of materials. Consequently, in a portion where these layers are in contact with each other (part A of FIG. 7(c)), the layer separation can be prevented, when heat or mechanical stress is applied. Thus, the reliability of the capacitive element 23 can be further enhanced.

It should be noted that this embodiment is not limited to this and that the lower barrier layer 13 may also be made of the BST film, which is the same material as the capacitor dielectric layers 16a. This makes the capacitors $Q_1$ and $Q_2$ interposed from below and above between the lower barrier layer 13 and the upper barrier layer 20, which are made of the same material. Accordingly, the layer separation due to the difference between the thermal expansion coefficients can be prevented more effectively.

(3) Third Embodiment

Figure 9:
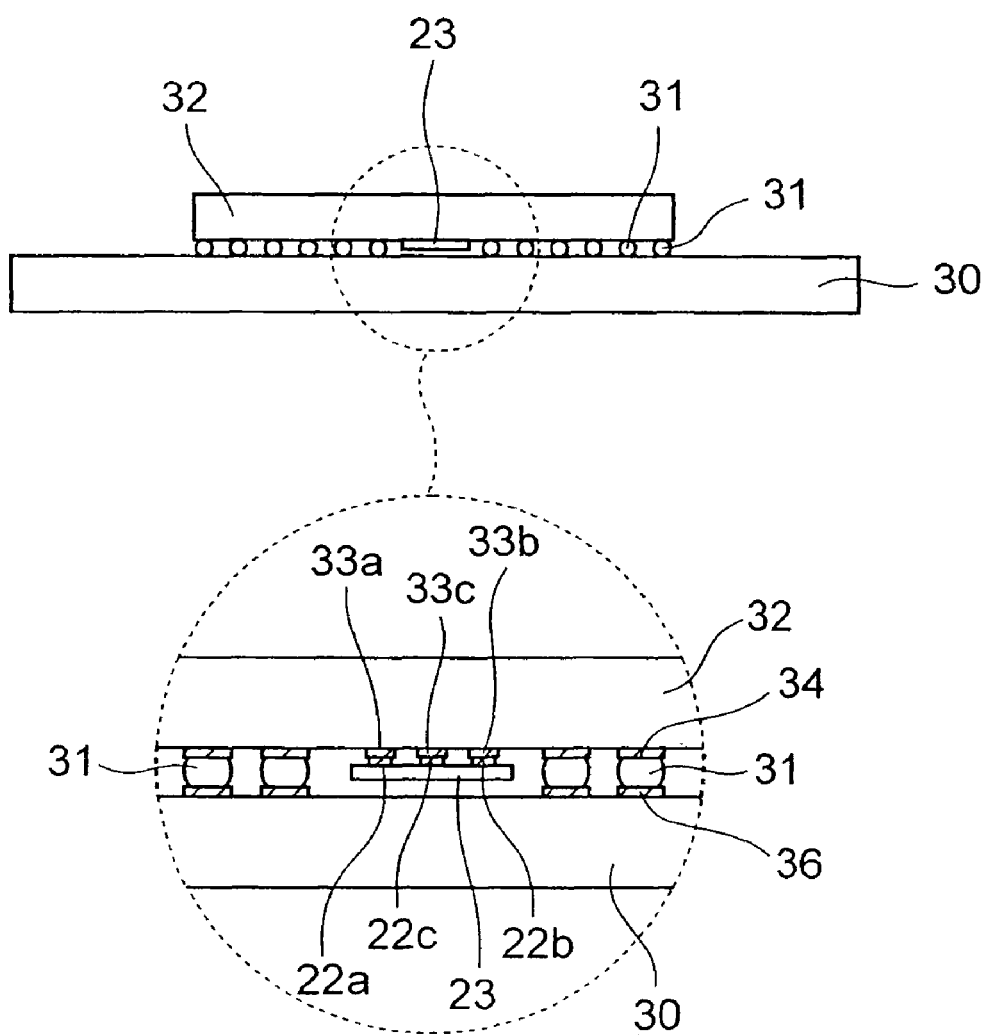
FIG. 9 is a cross-sectional view of a semiconductor device according to a third embodiment of the present invention.

FIG. 9 is a cross-sectional view of a semiconductor device according to this embodiment.

As shown in FIG. 9, this semiconductor device is made by mounting the capacitive element 23 fabricated in the first or second embodiment on a semiconductor element 32 such as an LSI. First electrode pads 33a to 33c are provided in the semiconductor element 32, and the first electrode pads 33a to 33c correspond to the respective pads 22a to 22c of the capacitive element 23. The electrode pads 33a to 33c are made of Au, and electrically and mechanically connected to the pads 22a to 22c by ultrasonic bonding.

The function of the capacitive element 23 in this case is not particularly limited, but the capacitive element 23 is preferably used as decoupling capacitors for the semiconductor element 32.

Furthermore, second electrode pads 34 are provided in the semiconductor element 32, and the second electrode pads 34 are electrically and mechanically connected to terminals 36 of a mounting board 30 such as a mother board through solder bumps 31.

In the above-described semiconductor device, the capacitive element 23 fabricated in the first or second embodiment is approximately 10 μm or less in thickness, and the thickness thereof is smaller than the heights of the bumps 31. This eliminates the necessity of providing in the mounting board 30 a recessed portion for containing the capacitive element 23. This also makes it possible to easily mount the capacitive element 23 on the mounting board 30. Thus, a capacitive element according to this embodiment can contribute to the miniaturization of the semiconductor device.

Moreover, in the case where the capacitive element 23 is used as decoupling capacitors, since the capacitive element 23 is mounted directly on the semiconductor element 32, the length of wiring between the semiconductor element 32 and the capacitive element 23 can be made as short as possible. As a result, the inductances of the wiring can be reduced, and voltage fluctuations in the semiconductor element 32 can be effectively absorbed by the capacitive element 23. Thus, electrical characteristics of the semiconductor element 32 can be improved.

(4) Fourth Embodiment

Figure 10:
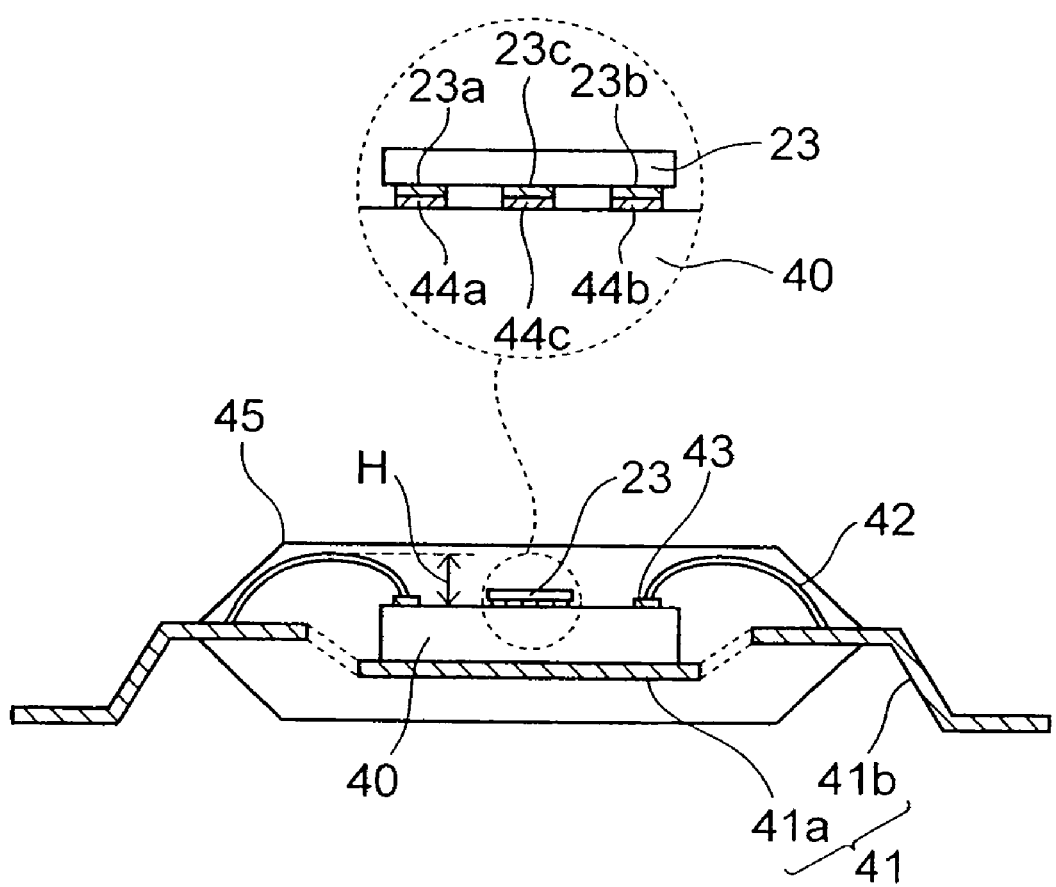
FIG. 10 is a cross-sectional view of a semiconductor device according to a fourth embodiment of the present invention.

FIG. 10 is a cross-sectional view of a semiconductor device according to this embodiment.

As shown in FIG. 10, in this semiconductor device, a semiconductor element 40 such as an LSI is fixed on a die pad 41a of a lead frame 41 with an unillustrated adhesive agent. Electrode pads 44a to 44c are formed on a circuit-formed surface of the semiconductor element 40. The electrode pads 44a to 44c are made of Au and correspond to the respective pads 23a to 23c of the capacitive element 23. The pads 23a to 23c and the electrode pads 44a to 44c are electrically and mechanically connected to each other by ultrasonic bonding.

In a vicinity of the periphery of the semiconductor element 40, bonding pads 43 are formed. The bonding pads 43 and the tips of leads 41 are wire-bonded to each other by using thin metal wires 42 such as gold wires. The thin metal wires 42, the semiconductor element 40, and the capacitive element 23 are sealed with sealing resin (sealing body) 45 to be prevented from being exposed to outside air, and thereby from degradation.

In the above-described semiconductor device, the thickness of the capacitive element 23 fabricated in the first or second embodiment is as thin as approximately 10 μm or less and not more than the heights H (=150 μm) of the thin metal wires 42. Thus, a cavity of a molding die used for molding the sealing resin 45 and the capacitive element 23 do not interfere with each other, and the outer size of an existing semiconductor device can be used as it is without change. Accordingly, the design of the semiconductor device can be simplified.

In addition, the use of this capacitive element 23 as decoupling capacitors for the semiconductor element 40 makes it possible to improve electrical characteristics of the semiconductor element 40 for the same reason as in the third embodiment.

As described above, a capacitive element according to the present invention includes a lower barrier layer under capacitors, and an upper barrier layer covering at least capacitor dielectric layers and a lower barrier layer. Accordingly, water and the like are blocked by these barrier layers, and the capacitor dielectric layers can be prevented from degrading due to a reducing atmosphere. Consequently, the reliability of the capacitive element can be enhanced.

Moreover, in a capacitive element manufacturing method according to the present invention, capacitors are formed on a supporting substrate, and the supporting substrate is removed after the capacitors are formed. Accordingly, the handling during manufacturing a capacitive element can be made favorable.

Furthermore, since an upper barrier layer covering capacitor dielectric layers and a lower barrier layer are formed after the formation of the capacitors, these barrier layers prevent water and the like from entering the capacitor dielectric layers from the outside. Thus, the capacitor dielectric layers can be prevented from degrading.

The invention claimed is:

1. A capacitive element comprising:
a base formed of flexible resin;
a lower barrier layer coupled on the base;
a capacitor coupled on the lower barrier layer, the capacitor including a lower electrode, a capacitor dielectric layer and an upper electrode in this order on the lower barrier layer; and
an upper barrier layer covering at least the capacitor dielectric layer and the lower barrier layer,
wherein at least one of the lower barrier layer and the upper barrier layer is made of an amorphous metal oxide material, and
the lower electrode has a double-layered structure that consists of an adhesion layer formed on the lower barrier layer, and a main conductive layer formed on the adhesion layer, made of a material different from that of the adhesion layer and being thicker than the adhesion layer.

2. The capacitive element according to claim 1, wherein the upper barrier layer is made of the same material as the capacitor dielectric layer.

3. The capacitive element according to claim 2, wherein both of the upper barrier layer and the capacitor dielectric layer are made of any one of BST ($Ba_xSr_{1-x}TiO_3$) and PZT ($Pb(Zr, Ti)O_3$).

4. The capacitive element according to claim 2, wherein the lower barrier layer is made of the same material as the capacitor dielectric layer.

5. The capacitive element according to claim 1, wherein a total height of the base, the lower barrier layer, the capacitor, and the upper barrier layer is less than 10 μm.

6. The capacitive element according to claim 1, wherein a protective layer is formed on the upper barrier layer.

7. A semiconductor device comprising:
a semiconductor element; and
a capacitive element including: a base formed of flexible resin; a lower barrier layer coupled on the base; a capacitor coupled on the lower barrier layer, the capacitor including (i) a lower electrode, (ii) a capacitor dielectric layer and (iii) an upper electrode in this order on the lower barrier layer; and an upper barrier layer covering at least the capacitor dielectric layer and the lower barrier layer, the capacitive element being mounted on one of the surfaces of the semiconductor element,
wherein at least one of the lower barrier layer and the upper barrier layer is made of an amorphous metal oxide material, and
the lower electrode has a double-layered structure that consists of an adhesion layer formed on the lower barrier layer, and a main conductive layer formed on the adhesion layer, made of a material different from that of the adhesion layer and being thicker than the adhesion layer.

8. The semiconductor device according to claim 7, wherein the capacitive element functions as a decoupling capacitor for the semiconductor element.

9. The capacitive element according to claim 1, wherein the amorphous metal oxide material is an alumina.

10. The semiconductor device according to claim 7, wherein the amorphous metal oxide material is an alumina.

11. The capacitive element according to claim 1, wherein the adhesion layer is made of Ti—W alloy.

* * * * *

UNITED STATES PATENT AND TRADEMARK OFFICE
CERTIFICATE OF CORRECTION

PATENT NO. : 8,264,063 B2
APPLICATION NO. : 12/222764
DATED : September 11, 2012
INVENTOR(S) : Takeshi Shioga et al.

Page 1 of 1

It is certified that error appears in the above-identified patent and that said Letters Patent is hereby corrected as shown below:

On the Title page;
Change

"Related U.S. Application Data

(62) Division of application No. 11/581,383, filed on Oct. 17, 2006, now Pat. No. 7,439,199."

To be

--Related U.S. Application Data

(62) Division of application No. 11/581,383, filed on Oct. 17, 2006, now Pat. No. 7,439,199, which is a Continuation of PCT/JP2004/010132 filed on July 15, 2004--

Signed and Sealed this
Twelfth Day of February, 2013

Teresa Stanek Rea
*Acting Director of the United States Patent and Trademark Office*